(12) United States Patent
Lee et al.

(10) Patent No.: US 8,441,100 B2
(45) Date of Patent: May 14, 2013

(54) CAPACITOR WITH PILLAR TYPE STORAGE NODE AND METHOD FOR FABRICATING THE SAME

(75) Inventors: Kee-Jeung Lee, Ichon-shi (KR);
Han-Sang Song, Ichon-shi (KR);
Deok-Sin Kil, Ichon-shi (KR);
Young-Dae Kim, Ichon-shi (KR);
Jin-Hyock Kim, Ichon-shi (KR);
Kwan-Woo Do, Ichon-shi (KR);
Kyung-Woong Park, Ichon-shi (KR)

(73) Assignee: Hynix Semiconductor Inc., Icheon-si (KR)

(*) Notice: Subject to any disclaimer, the term of this patent is extended or adjusted under 35 U.S.C. 154(b) by 0 days.

(21) Appl. No.: 13/069,280

(22) Filed: Mar. 22, 2011

(65) Prior Publication Data

US 2011/0169134 A1 Jul. 14, 2011

Related U.S. Application Data

(62) Division of application No. 12/164,073, filed on Jun. 29, 2008, now Pat. No. 7,910,428.

(30) Foreign Application Priority Data

Jul. 2, 2007 (KR) .......................... 10-2007-0066054

(51) Int. Cl.
*H01L 21/02* (2006.01)
(52) U.S. Cl.
USPC .................................. 257/532; 257/E29.002
(58) Field of Classification Search .................. 257/532, 257/E29.002
See application file for complete search history.

(56) References Cited

U.S. PATENT DOCUMENTS

| | | | |
|---|---|---|---|
| 2001/0044179 A1* | 11/2001 | Kim | 438/243 |
| 2006/0216884 A1* | 9/2006 | Choi | 438/240 |

FOREIGN PATENT DOCUMENTS

| | | |
|---|---|---|
| JP | 11-017144 | 1/1999 |
| KR | 1020060018933 A | 3/2006 |
| KR | 1020060069592 A | 6/2006 |

* cited by examiner

*Primary Examiner* — Kimberly Rizkallah
*Assistant Examiner* — Marvin Payen
(74) *Attorney, Agent, or Firm* — Kilpatrick Townsend & Stockton LLP

(57) ABSTRACT

A capacitor includes a pillar-type storage node, a supporter disposed entirely within an inner empty crevice of the storage node, a conductive capping layer over the supporter and contacting the storage node so as to seal an entrance to the inner empty crevice, a dielectric layer over the storage node, and a plate node over the dielectric layer.

13 Claims, 7 Drawing Sheets

CAPACITOR WITH PILLAR TYPE STORAGE NODE AND METHOD FOR FABRICATING THE SAME

CROSS-REFERENCE TO RELATED APPLICATIONS

The present invention is a divisional of U.S. patent application Ser. No. 12/164,073, filed on Jun. 29, 2008, now U.S. Pat. No. 7,910,428, which claims priority of Korean patent application number 10-2007-0066054, filed on Jul. 2, 2007, both of which are incorporated by reference in their entirety.

BACKGROUND OF THE INVENTION

The present invention relates to a semiconductor device, and more particularly, to a capacitor with a pillar type storage node and a method for fabricating the same.

Due to recent rapid development of ultra-fine semiconductor fabrication processes, the integration density of memory devices is rapidly increasing. Thus, a unit cell area is greatly reduced and a memory device operates at a lower voltage. However, in spite of the reduced unit cell area, charge capacity required for operation of a memory device must maintain an adequate capacity of more than 25 fF/cell in order to prevent soft error and reduction of a refresh time.

Under these circumstances, many research and development projects have been conducted on a metal-insulator-metal (MIM) capacitor employing a high-k dielectric layer in order to obtain sufficient charge capacity for next-generation dynamic random access memory (DRAM) devices.

In DRAM devices employing a 50 nm to 60 nm metal interconnection process, a storage node changes from a concave shape to a cylindrical shape in order to obtain more capacitance (that is, a cell capacitance of more than approximately 25 fF/cell).

However, the cylindrical storage node is difficult to use in a capacitor of a gigabit DRAM device employing the metal interconnection having sub-50-nm line width. This is because the cell region does not have enough space to form a capacitor by forming a dielectric layer of approximately 100 Å and a plate node of approximately 200 Å, while securing a space of approximately 25 nm (250 Å) for insulation between adjacent storage nodes.

Recently, there was proposed a capacitor with a pillar type storage node, which is capable of securing a sufficient space for insulation between adjacent storage nodes and obtaining high capacitance in sub-50-nm DRAM devices.

FIGS. 1A and 1B illustrate a method for fabricating a capacitor with a typical pillar type storage node.

Referring to FIG. 1A, a sacrificial layer 12 is formed over a substrate 11 where a predetermined process is completed. The sacrificial layer 12 is etched to form an open region, and a conductive layer 13 is formed to fill the open region.

Referring to FIG. 1B, a storage node 13A is formed by performing a storage node separating process on the conductive layer 13, a wet full dip out process is performed to remove the sacrificial layer 12.

However, a minute crevice 14 is formed over the center axis of the pillar type storage node 13A even if the conductive layer 13 is formed to fill the open region. Accordingly, a wet etchant can penetrate deeply into the minute crevice 14 during a subsequent wet full dip out process, and a part of the wet etchant can remain even after a drying process to cause a defect 15 such as watermarks.

Additionally, since the minute crevice 14 causes a shear stress between storage node walls on both sides of the minute crevice 14 during a subsequent thermal treatment, the storage node itself can bend to cause a bridge 16 between the adjacent storage nodes.

SUMMARY OF THE INVENTION

Embodiments of the present invention relate to a capacitor, which is capable of securing a space enough for insulation between adjacent storage nodes in sub-50-nm dynamic random access memory (DRAM) devices and obtaining high charge capacity, and a method for fabricating the capacitor.

Embodiments of the present invention are also directed to providing a capacitor, which is capable of preventing defects, which are caused by a minute crevice, and the bending of storage nodes, which is caused by a shear stress, when forming a pillar-type storage node, and a method for fabricating the same.

In accordance with an aspect of the present invention, there is provided a capacitor. The capacitor includes a pillar-type storage node, a supporter filling an inner empty crevice of the storage node, a dielectric layer over the storage node, and a plate node over the dielectric layer.

In accordance with another aspect of the present invention, there is provided a method for fabricating a capacitor. The method includes forming a sacrificial layer with an open region, forming a pillar-type storage node by filling the opening region of the sacrificial layer and filling an inside empty crevice with a supporter, removing the sacrificial layer, forming a dielectric layer over the storage node, and forming a plate node on the dielectric layer.

DESCRIPTION OF SPECIFIC EMBODIMENTS

Hereinafter, a capacitor with a pillar type storage node and a method for fabricating the same in accordance with the present invention will be described in detail with reference to the accompanying drawings.

It will be understood that when an element such as a layer, a film, a pattern and a region is referred to as being 'on/under' another element herein, it may be directly on/under the other element, and one or more intervening elements may also be present.

In accordance with the present invention, a storage node is formed in a pillar form in order to achieve high charge capacity while obtaining a sufficient space of more than 25 nm for insulation between adjacent storage nodes in a highly integrated capacitor used in a sub-50-nm semiconductor device.

In addition, the present invention applies a sealing structure for sealing a minute crevice when forming a pillar type storage node in order to prevent a wet etchant from deeply penetrating into the minute crevice in a pillar center axis.

Furthermore, the present invention prevents a storage node from being bent by a shear stress during a subsequent thermal treatment because a supporter fills the empty crevice of the pillar type storage node.

Figure 1A:
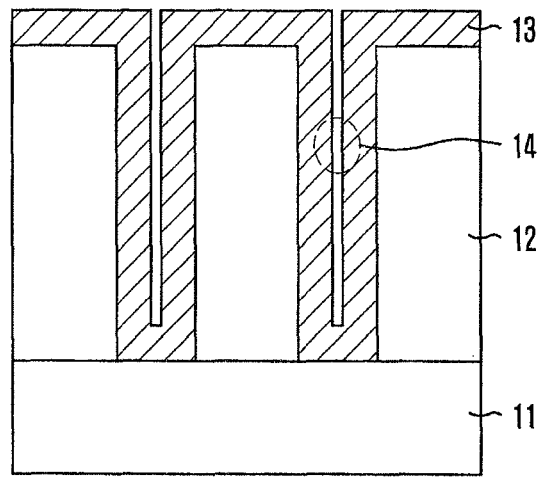
FIGS. 1A and 1B illustrate a typical method for fabricating a capacitor with a pillar type storage node.
Figure 1B:
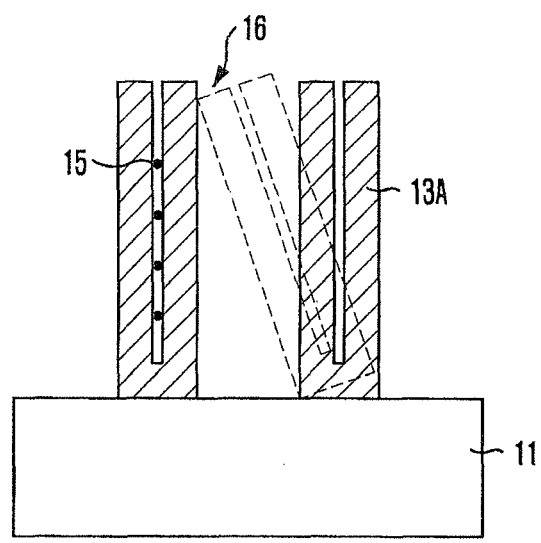
Figure 2:
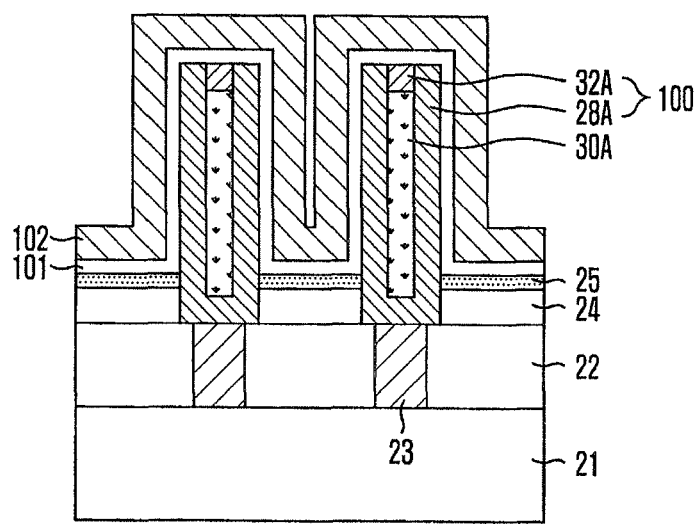
FIG. 2 illustrates a cross-sectional view of a capacitor in accordance with an embodiment of the present invention.

FIG. 2 illustrates a cross-sectional view of a capacitor in accordance with an embodiment of the present invention.

Referring to FIG. 2, the capacitor includes a pillar type storage node 100, a supporter 30A filling an inner empty crevice of the pillar type storage node 100, a dielectric layer 101 formed on the pillar type storage node 100, and a plate node 102 formed on the dielectric layer 101.

The storage node 100 includes a cylinder 28A and a capping layer 32A covering an entrance of the cylinder 28A, and thus its entire structure has a pillar structure with an empty crevice. The capping layer 32A covers the entrance of the cylinder 28A to seal the inner crevice of the pillar.

The cylinder 28A and the capping layer 32A may be formed of a conductive material to serve as the storage node 100. The cylinder 28A and the capping layer 32A may be formed of one material selected from the group consisting of ruthenium (Ru), ruthenium dioxide ($RuO_2$), tungsten (W), tungsten nitride (WN), titanium nitride (TiN), tantalum nitride (TaN), iridium (Ir), iridium oxide ($IrO_2$), and platinum (Pt). The cylinder 28A and the capping layer 32A may be formed of a material containing ruthenium (Ru), for example, ruthenium (Ru) and ruthenium oxide ($RuO_2$).

The supporter 30A fills the inner crevice of the storage node 100 and a material of the supporter 30A is different from that of the storage node 100. The supporter 30A is an insulation layer. The supporter 30A may be formed of oxide or nitride. For example, the supporter 30A is formed of one material selected from the group consisting of silicon nitride ($Si_3N_4$), aluminum oxide ($Al_2O_3$), hafnium oxide ($HfO_2$), and zirconium oxide ($ZrO_2$).

The plate node 102 may be formed of one material selected from the group consisting of ruthenium (Ru), ruthenium oxide ($RuO_2$), tungsten (W), tungsten nitride (WN), titanium nitride (TiN), tantalum nitride (TaN), iridium (Ir), iridium oxide ($IrO_2$), and platinum (Pt).

The dielectric layer 101 may be formed of one material selected from the group consisting of aluminum oxide ($Al_2O_3$), zirconium oxide ($ZrO_2$), hafnium oxide ($HfO_2$), tantalum oxide ($Ta_2O_5$), and titanium oxide ($TiO_2$). Also, the dielectric layer 101 may be formed of a dual layer, a triple layer, or a mixed layer containing one of aluminum oxide ($Al_2O_3$), zirconium oxide ($ZrO_2$), hafnium oxide ($HfO_2$), tantalum oxide ($Ta_2O_5$), and titanium oxide ($TiO_2$). The dielectric layer 101 may be formed of a high-k dielectric, for example, barium titanate oxide (BTO) or barium strontium titanate (BST). The dielectric layer 101 has a thickness ranging from approximately 50 Å to approximately 200 Å.

A contact plug 23 is formed below the storage node 100, and a substrate 21 is formed below the contact plug 23. The contact plug 23 is insulated from an adjacent contact plug by an interlayer insulation layer 22. A lower portion of sidewalls of the storage node 100 is supported by a buffer oxide layer 24 and an etch stop layer 25. The etch stop layer 25 is formed of nitride.

Referring to FIG. 2, an entire structure of the storage node 100 including the cylinder 28A and the capping layer 32A has a pillar form, and the inner empty crevice of the storage node 100 is sealed by the capping layer 32A. Therefore, it is possible to prevent a wet etchant from penetrating into the inside of the storage node 100 during a subsequent wet etching process. Furthermore, since the supporter 30A fills the storage node 100, a shear stress between the inner walls of the storage node 100 can be suppressed.

FIGS. 3A to 3H illustrate a method for fabricating a capacitor with a pillar type storage node in accordance with an embodiment of the present invention.

Figure 3A:
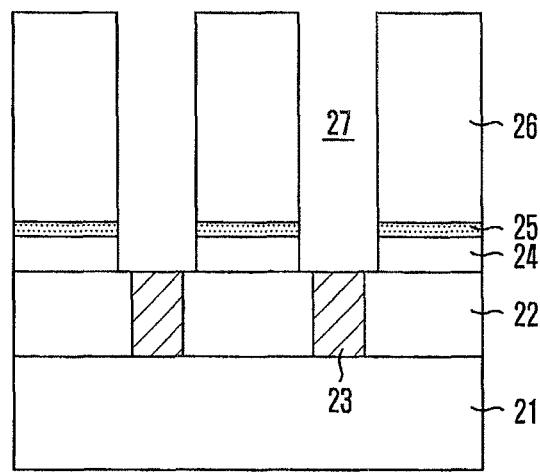
FIGS. 3A to 3H illustrate a method for fabricating a capacitor with a pillar type storage node in accordance with an embodiment of the present invention.

Referring to FIG. 3A, an interlayer insulation layer 22 is formed over a substrate 21. The interlayer insulation layer 22 is etched to form a contact hole (no assigned reference number) exposing the surface of the substrate 21. A contact plug 23 is formed to fill the contact hole. At this point, processes necessary for a DRAM structure such as isolation, a gate, and a bit line has been performed on the substrate 21. The substrate 21 may be a silicon substrate, an impurity implantation layer, or a landing plug contact.

Additionally, the contact plug 23 is a polysilicon plug formed by forming polysilicon and performing an etchback process on the formed polysilicon, and it serves as a storage node contact (SNC) plug.

A buffer oxide layer 24 is formed over the interlayer insulation layer 22, and an etch stop layer 25 is formed on the buffer oxide layer 24. The buffer oxide layer 24 may be formed of one material selected from the group consisting of undoped silicate glass (USG), phosphosilicate glass (PSG), borophosphosilicate glass (BPSG), hemispherical silicate glass (HSG), plasma-enhanced tetraethylorthosilicate (PE-TEOS), and tantalum oxide ($Ta_2O_5$). The buffer oxide layer 24 has a thickness ranging from approximately 500 Å to approximately 3,000 Å. The etch stop layer 25 includes a nitride layer, especially, a silicon nitride ($Si_3N_4$) layer. On the other hand, the etch stop layer 25 may be directly formed over the interlayer insulation layer 22 without forming the buffer oxide layer 24.

A sacrificial layer 26 is formed over the etch stop layer 25. The sacrificial layer 26 is formed of oxide, for example, the sacrificial layer 26 may be formed of one of PSG, PETEOS, USG, and high-density polyethylene (HDP), or may have a stacked structure containing at least two materials of PSG, PETEOS, USG, and high-density plasma (HDP).

A storage node region, that is, an open region, is formed by performing an etching process to expose the surface of the contact plug 23. The open region 27 may have a circular or oval hole structure in a plane. Additionally, the open region 27 may have a polygonal hole structure.

The open region 27 is formed by etching the sacrificial layer 26, etching the etch stop layer 25, and etching the buffer oxide layer 24. On the other hand, if the height of the sacrificial layer 26 is increased in order to obtain charge capacity, the etching process may be performed using a hard mask. This is because the etching is difficult if only a photoresist layer is used. The hard mask layer may be a polysilicon layer or an amorphous carbon layer.

Figure 3B:
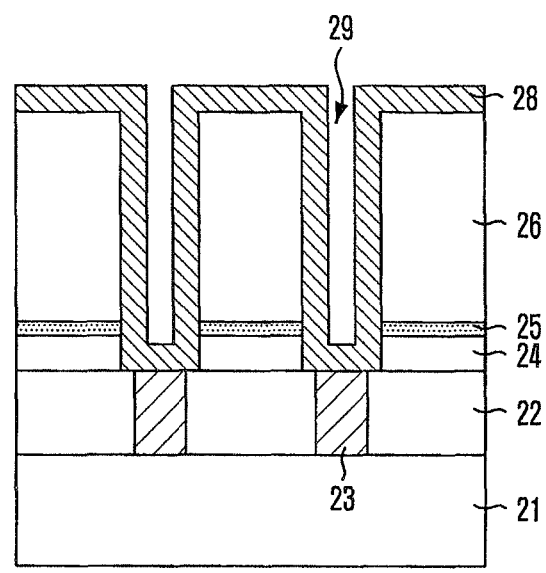

Referring to FIG. 3B, a first conductive layer 28 to be used as a storage node is formed over the resulting structure including the open region 27. The first conductive layer 28 may be formed of one material selected from the group consisting of ruthenium (Ru), ruthenium oxide ($RuO_2$), tungsten (W), tungsten nitride (WN), titanium nitride (TiN), tantalum nitride (TaN), iridium (Ir), iridium oxide ($IrO_2$), and platinum (Pt). It is preferable to form the first conductive layer 28 containing ruthenium (Ru), for example, ruthenium (Ru) and ruthenium dioxide ($RuO_2$).

The first conductive layer 28 is formed to fill the open region 27 during a formation process in order to form the storage node in a pillar shape.

Even though the first conductive layer 28 is formed to fill the open region 27, a crevice is inevitably formed at the center axis of the pillar. The wet etchant penetrates the crevice during a subsequent wet dip out process and some components of the wet etchant remain even after a drying process.

Although formation depth will vary according to the bottom line width of the open region 27, the first conductive layer 28 is formed to a thickness of approximately 100 Å to approximately 300 Å to thereby leave the crevice 29 with a diameter of approximately 50 Å to approximately 300 Å inside the open region 27. The first conductive layer 28 is formed according to a large aspect ratio of the open region 27, even if the diameter of the crevice 29 is not adjusted. Therefore, the crevice 29 is formed in the inside of the first conductive layer 28 (inside of the central axis) in the open region 27. In accordance with the embodiment of the present invention, the diameter of the crevice 29 is increased by thinly forming the first conductive layer 28 to a thickness of approximately 100 Å to approximately 300 Å. This is done for enable a subsequent supporter 30 to sufficiently fill the crevice 29. If the first conductive layer 28 is formed without securing the adequate diameter of the crevice 29, the crevice 29 becomes too narrow to completely fill with the subsequent supporter 30, causing defects. If the subsequent supporter 30 does not completely fill in the crevice 29, a penetration path of the wet etchant can be blocked, but it becomes difficult to suppress a shear stress generated during a subsequent thermal treatment. On the other hand, if the first conductive layer 28 has a thickness of approximately 100 Å to approximately 300 Å, the first conductive layer 28 can be sufficiently used as the storage node. Thus, the first conductive layer 28 may be thinly formed.

Figure 3C:
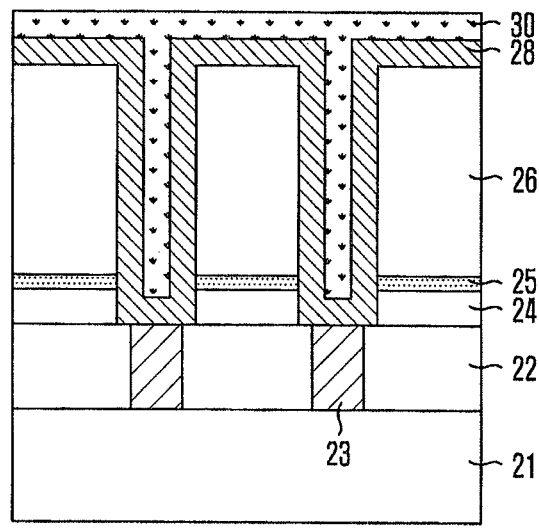

Referring to FIG. 3C, a supporter 30 is formed to fill the crevice 29 in the center axis of the first conductive layer 28. If the supporter 30 fills in the crevice 29, the penetration of the wet etchant is suppressed and it is possible to prevent a shear stress from being generated between the walls of the storage node.

The supporter 30 is formed of a material different from that of the first conductive layer 28. The supporter 30 is an insulation layer. The supporter 30 may includes a nitride layer or an oxide layer. The nitride layer includes a silicon nitride ($Si_3N_4$) layer, and the oxide layer includes a metal oxide layer such as an aluminum oxide ($Al_2O_3$) layer, a hafnium oxide ($HfO_2$) layer, and a zirconium ($ZrO_2$) layer. The supporter 30 has the formation thickness of approximately 100 Å to approximately 500 Å and has a predetermined thickness on the first conductive layer 28 so that it can completely fill the crevice 29.

Figure 3D:
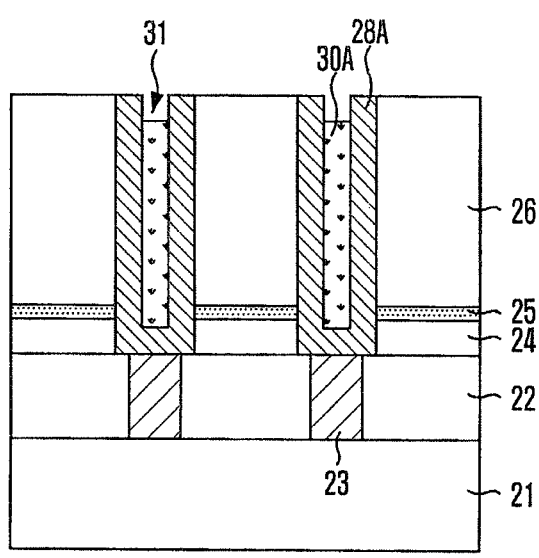

Referring to FIG. 3D, an etchback process is performed on the supporter 30 and the first conductive layer 28 to expose the surface of the sacrificial layer 26. Therefore, the supporter 30A and the cylinder 28A remain only in the open region 27. The cylinder 28A is a pattern of the first conductive layer 28 and is filled with the supporter 30A.

The above etchback process is a dry etchback process, and has a target depth of approximately 200 Å to approximately 2,000 Å during the etchback process. An etch selectivity is adjusted to further etch the supporter 30A during the etchback process so that a groove 31 having a predetermined depth is formed over the supporter 30A.

Figure 3E:
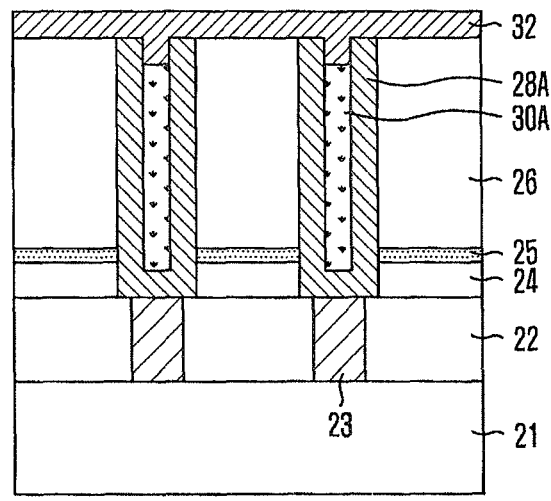

Referring to FIG. 3E, a second conductive layer 32 is formed over the resulting structure. Therefore, the groove 31 on the supporter 30A is filled with the second conductive layer 32 so that the top of the supporter 30A is covered with the second conductive layer 32.

Since the second conductive layer 32 is formed of the same material as the first conductive layer 28 used as the cylinder 28A, the adhesiveness between the second conductive layer 32 and the cylinder 28A increases. Therefore, no crevice is formed at the contact interface between the cylinder 28A and the second conductive layer 32. Like the first conductive layer 28, the second conductive layer 32 may be formed of a material containing ruthenium (Ru), for example, ruthenium (Ru) or ruthenium oxide ($RuO_2$).

By further forming the second conductive layer 32 to cover the entrance of the cylinder 28A, it is possible to further prevent a wet etchant from penetrating into the cylinder 28A during a subsequent wet etching process.

Figure 3F:
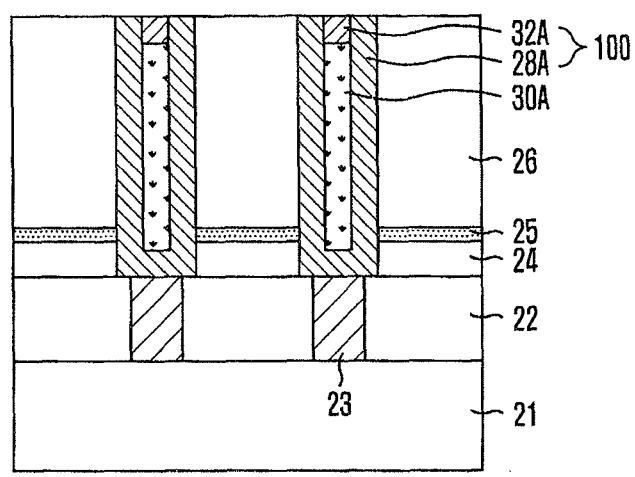

Referring to FIG. 3F, a storage node isolation process is performed. For example, a blanket dry etchback process is performed on the second conductive layer 32 so that the capping layer 32A remains only in the open region 27. A chemical mechanical polishing (CMP) process may be performed as the storage node isolating process. Furthermore, the adjacent storage nodes can be isolated from each other by sequentially performing the blanket etchback process and the CMP process.

Therefore, the cylinder 28A, the supporter 30A, and the capping layer 32A remain in the open region 27, and the cylinder 28A and the capping layer 32A are connected to each other to form a pillar type storage node 100. The supporter 30A exists in the charge storage node 100 including the cylinder 28A and the capping layer 32A. That is, the supporter 30A is formed inside the pillar type storage node 100.

As mentioned above, the penetration path of the wet etchant is blocked because the inside of the storage node 100 is sealed by the capping layer 32A.

Figure 3G:
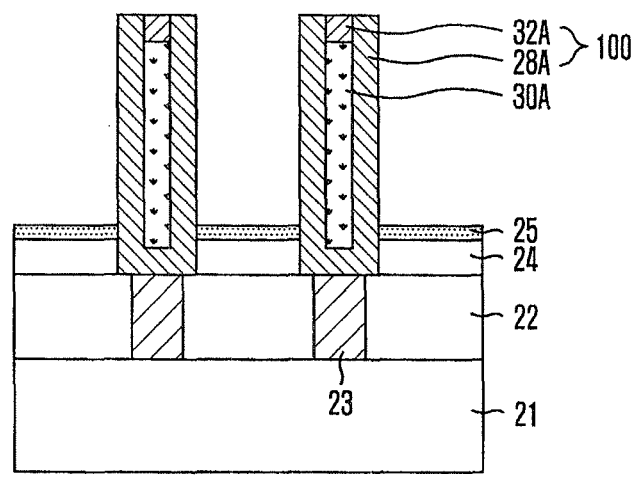

Referring to FIG. 3G, the sacrificial layer 26 is removed. At this point, the sacrificial layer 26 is removed through a wet full dip out process. A wet etchant such as hafnium (HF) or buffered oxide etch (BOE) is used to remove the sacrificial layer 26 because the sacrificial layer 26 is an oxide layer. Then, a drying process is performed. Due to the etch stop layer 25, the lower structure of the pillar type storage node 100 is not damaged during the wet full dip out process.

The wet etchant used in the wet full dip out process does not penetrate into the storage node 100 because the inside of the storage node 100 is sealed by the capping layer 32A and thus all the penetration paths of the wet etchant are blocked.

When the wet full dip out process and the drying process are completed, the storage node 100 has a pillar shape having a crevice, and the top surface and sidewall of the storage node 100 are exposed to the outside. Moreover, the supporter 30A is disposed in the storage node 100. If the open area is a circular hole structure, the storage node 100 has a circular pillar shape.

Since the supporter 30A is formed on the inner sidewalls of the storage node 100, it is possible to fundamentally prevent the generation of a shear stress between the walls even if a subsequent thermal treatment is performed. Therefore, the bending of the storage node 100 can be prevented during a subsequent thermal treatment. On the other hand, an insulation layer such as an oxide layer or a nitride layer is used as the supporter 30A in order to suppress the shear stress. If the supporter 30A is a conductive layer, the bending of the storage node 100 cannot be prevented because the shear stress is transferred through the supporter 30A within the wall of the storage node 100. Consequently, the supporter 30A may include an insulation layer in order to buffer the shear stress of the storage node 100.

Figure 3H:
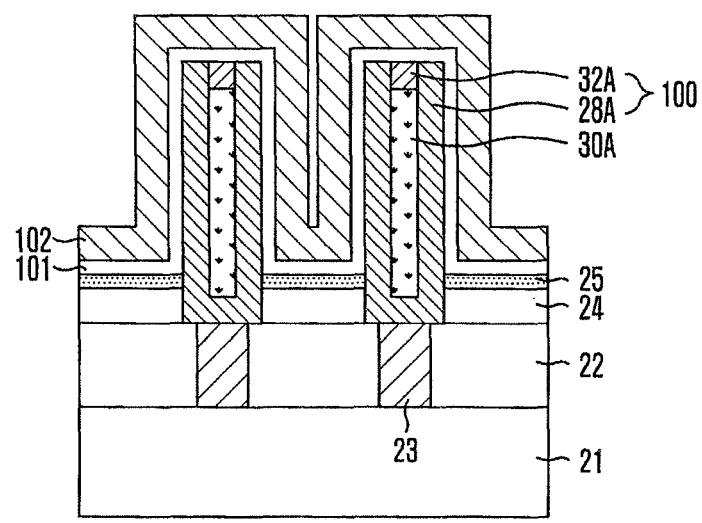

Referring to FIG. 3H, a dielectric layer 101 is formed over the storage node 100. The dielectric layer 101 may be formed of one material selected from the group consisting of aluminum oxide ($Al_2O_3$), zirconium oxide ($ZrO_2$), hafnium oxide ($HfO_2$), tantalum oxide ($Ta_2O_5$), and titanium oxide ($TiO_2$). Also, the dielectric layer 101 may be formed of a dual layer, a triple layer, or a mixed layer containing one of aluminum oxide ($Al_2O_3$), zirconium oxide ($ZrO_2$), hafnium oxide ($HfO_2$), tantalum oxide ($Ta_2O_5$), and titanium oxide ($TiO_2$). The dielectric layer 101 may be formed of a high-k dielectric, for example, barium titanate oxide (BTO) or barium strontium titanate (BST). The dielectric layer 101 has a thickness ranging from approximately 50 Å to approximately 200 Å.

A plate node 102 is formed over the dielectric layer 101. The plate node 102 may be formed of one material selected from the group consisting of ruthenium (Ru), ruthenium oxide (RuO$_2$), tungsten (W), tungsten nitride (WN), titanium nitride (TiN), tantalum nitride (TaN), iridium (Ir), iridium oxide (IrO$_2$), and platinum (Pt).

Figure 4:
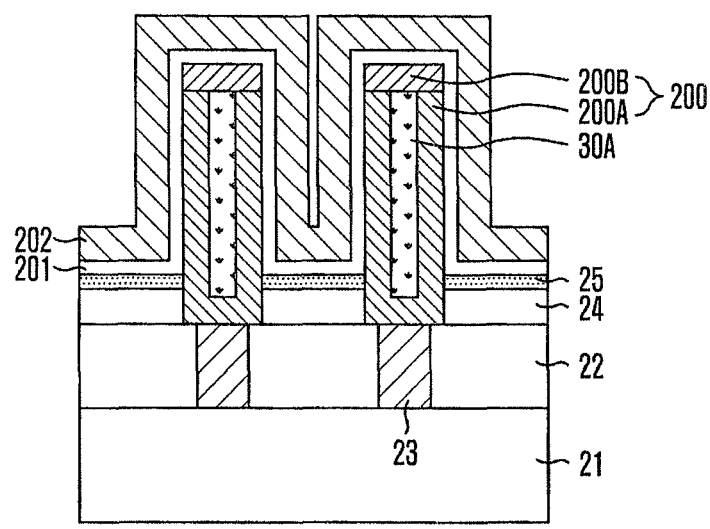
FIG. 4 illustrates a cross-sectional view of a capacitor in accordance with another embodiment of the present invention.

FIG. 4 illustrates a cross-sectional view of a capacitor in accordance with another embodiment of the present invention. The capacitor of FIG. 4 is a modification of the storage node including the cylinder and the capping layer. Reference numbers of FIG. 4 except the storage node 200, the dielectric layer 201, and the plate node 202 are the same as those of FIG. 3H.

Referring to FIG. 4, the storage node 200 has a pillar shape as a whole and includes a cylinder 200A and a capping layer 200B. An etchback process is performed on the cylinder 200A so that it has the same height as the supporter 30A. Therefore, the capping layer 200B is formed to cover the top surfaces of the supporter 30A and the cylinder 200A. That is, the capping layer 200B covers the top surface and the entrance of the cylinder 200A, thereby covering the top surface of the supporter 30A. In a process of forming the cylinder 200A to have the same height as the supporter 30A, the first conductive layer 28 and the supporter 30 are simultaneously etched by the etchback process illustrated in FIG. 3D.

In accordance with the present invention, since the supporter is formed in a pillar type storage node, it is possible to prevent the bending of the storage node due to the shear stress.

Additionally, since the pillar inner crevice is sealed by the capping layer (that is, the second conductive layer), it is possible to prevent unexpected defects and deteriorated electrical characteristics due to poor drying caused when the wet etchant penetrates through the minute crevice in the pillar center axis during a subsequent full dip out process.

As a result, since the pillar type capacitor structure is reinforced and electrical stability is achieved in the gigabit DRAM devices that use sub-50-nm metal interconnection process, the reliability and yield of a semiconductor device can be improved.

While the present invention has been described with respect to the specific embodiments, the above embodiments of the present invention are illustrative and not limitative. It will be apparent to those skilled in the art that various changes and modifications may be made without departing from the spirit and scope of the invention as defined in the following claims.

What is claimed is:

1. A capacitor provided in a semiconductor device, the capacitor comprising:
   a pillar-type storage node comprising a cylinder portion having an inner empty crevice;
   a supporter disposed entirely within the inner empty crevice of the storage node;
   a conductive capping layer over the supporter and contacting the storage node so as to seal an entrance to the inner empty crevice;
   a dielectric layer over the storage node; and
   a plate node over the dielectric layer.

2. The capacitor of claim 1, wherein the capping layer is disposed entirely within the inner empty crevice.

3. The capacitor of claim 1, wherein the capping layer contacts a top surface of the storage node and a top of the supporter.

4. The capacitor of claim 1, wherein the cylinder and the capping layer comprise the same conductive material.

5. The capacitor of claim 1, wherein the cylinder and the capping layer each comprises material containing ruthenium (Ru).

6. The capacitor of claim 5, wherein the material containing ruthenium (Ru) comprises ruthenium (Ru) or ruthenium dioxide (RuO$_2$), or both.

7. The capacitor of claim 1, wherein the supporter comprises an insulation layer.

8. The capacitor of claim 1, wherein the supporter comprises an oxide layer or a nitride layer.

9. The capacitor of claim 1, wherein the supporter comprises one material selected from the group consisting of silicon nitride (Si$_3$N$_4$), aluminum oxide (Al$_2$O$_3$), hafnium oxide (HfO$_2$), and zirconium oxide (ZrO$_2$).

10. The capacitor of claim 1, wherein the storage node comprises ruthenium (Ru) or ruthenium oxide (RuO$_2$), or both.

11. The capacitor of claim 1, wherein a top surface of the conductive capping layer is coplanar with a top surface of the storage node.

12. A capacitor provided in a semiconductor device, the capacitor comprising:
   a pillar-type storage node comprising a cylinder portion having an inner empty crevice;
   a dielectric supporter disposed entirely within the inner empty crevice of the storage node;
   a conductive capping layer over the dielectric supporter and contacting the storage node so as to seal an entrance to the inner empty crevice;
   a dielectric layer over the storage node; and
   a plate node over the dielectric layer.

13. A capacitor provided in a semiconductor device, the capacitor comprising:
   a pillar-type conductive storage node;
   a dielectric layer overlying an outer surface of the storage node; and
   a conductive plate node overlying the dielectric layer, thereby forming a capacitor in conjunction and the pillar-type storage node;
   wherein the pillar-type storage node includes:
     a cylindrical inner empty crevice;
     a dielectric supporter disposed entirely within the inner crevice of the storage node; and
     a conductive capping layer overlying the dielectric supporter and contacting the storage node so as to seal an entrance to the inner crevice of the storage node.

* * * * *